United States Patent
Zandi et al.

(10) Patent No.: US 7,369,393 B2
(45) Date of Patent: May 6, 2008

(54) ELECTROSTATIC CHUCKS HAVING BARRIER LAYER

(75) Inventors: Morteza Zandi, Shrewsbury, MA (US); Ara Vartabedian, Hudson, MA (US); Brian LaCourse, Pepperell, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 266 days.

(21) Appl. No.: 11/102,542

(22) Filed: Apr. 8, 2005

(65) Prior Publication Data

US 2005/0231887 A1 Oct. 20, 2005

Related U.S. Application Data

(60) Provisional application No. 60/562,372, filed on Apr. 15, 2004.

(51) Int. Cl.
*H01L 21/683* (2006.01)
*H01T 23/00* (2006.01)

(52) U.S. Cl. .................. 361/234; 361/233; 428/32.71; 428/49

(58) Field of Classification Search ............... 361/234, 361/233; 428/1.62, 32.71, 49
See application file for complete search history.

(56) References Cited

U.S. PATENT DOCUMENTS

| | | | |
|---|---|---|---|
| 5,998,321 A | 12/1999 | Katsuda et al. | |
| 6,001,760 A | 12/1999 | Katsuda et al. | |
| 6,071,630 A * | 6/2000 | Tomaru et al. | 428/627 |
| 6,204,489 B1 * | 3/2001 | Katsuda et al. | 219/544 |
| 6,452,775 B1 * | 9/2002 | Nakajima | 361/234 |
| 6,723,274 B1 | 4/2004 | Divakar | |
| 7,011,874 B2 * | 3/2006 | Ito et al. | 428/64.1 |
| 7,042,697 B2 * | 5/2006 | Tsuruta et al. | 361/234 |
| 2003/0029569 A1 * | 2/2003 | Natsuhara et al. | 156/345.51 |

FOREIGN PATENT DOCUMENTS

EP    1 156 522 A2    11/2001

* cited by examiner

*Primary Examiner*—Michael Sherry
*Assistant Examiner*—Zeev Kitov
(74) *Attorney, Agent, or Firm*—Larson Newman Abel Polansky & White, LLP

(57) ABSTRACT

An electrostatic chuck for supporting a semiconductor wafer, including: a chuck body having a dielectric region and an insulating region, the insulating region having a higher electrical resistivity than the dielectric region, an electrode embedded in the chuck body, and a barrier layer provided between dielectric region and the insulating region.

16 Claims, 3 Drawing Sheets

ELECTROSTATIC CHUCKS HAVING BARRIER LAYER

CROSS REFERENCE TO RELATED APPLICATIONS

This application claims priority to U.S. Provisional Application 60/562,372, filed Apr. 15, 2004, the subject matter thereof being incorporated by reference.

BACKGROUND

1. Field of the Invention

The present invention is generally directed to electrostatic chucks for use in semiconductor fabrication to hold semiconductor wafers in place for processing operations. Particularly, the present invention is directed to electrostatic chucks having tailored electrical resistivity properties and/or tailored compositions for improved performance, as well as methods for processing semiconductor wafers using such an electrostatic chuck.

2. Description of the Related Art

Electrostatic chucks, also know as susceptors, are employed to support substrates such as semiconductor (silicon) wafers during the manufacture of semiconductor devices. Electrostatic chucks are generally fabricated from ceramic materials, including aluminum nitride (AlN), which has a number of desirable properties. Such properties include desirable shock resistance, thermal conductivity, thermal expansion properties, and erosion and corrosion resistance in the semiconductor fabrication environment, which many times includes a corrosive plasma.

While various types of electrostatic chucks have been utilized in semiconductor fabrication, Coulombic and Johnson-Rahbek electrostatic chucks have been primarily used. Typically, Johnson-Rahbek electrostatic chucks have a dielectric ceramic body which has an electrical resistivity of $10^8$ to about $10^{13}$ ohm-cm, such as $10^9$ to about $10^{11}$ ohm-cm at working temperature. Working temperature may vary, such as room temperature for dry etching processing, and about 250° C. to about 700° C. for deposition processes (including PVD and CVD).

Various techniques have been employed in the art for reducing the intrinsic resistivity of pure aluminum nitride, which tends to be too high for efficient electrostatic chuck operation, such as on the order of $10^{13}$ ohm-cm. Such techniques include use of resistivity modifying agents to reduce the resistivity of the electrostatic chuck. While attempts at reducing the resistivity of aluminum nitride-based electrostatic chucks have been successful, it has been recognized that such low resistivities may undesirably result in leakage current, in which current flows away from the chucking surface supporting the semiconductor wafer. Such leakage current undesirably affects the chucking and de-chucking efficiency and performance. Accordingly, the art has sought to develop electrostatic chucks having reduced leakage current and improved chucking and de-chucking performance through the operational life of the electrostatic chuck.

SUMMARY

According to one embodiment of the present invention, an electrostatic chuck is provided for supporting a semiconductor wafer, which includes a chuck body including a dielectric region and an insulating region, an electrode embedded in the chuck body, and a barrier layer provided between the dielectric region and the insulating region. Typically, the insulating region has a higher electrical resistivity than the dielectric region.

According to another aspect of the present invention, an electrostatic chuck is provided for supporting a semiconductor wafer, which includes a chuck body including first and second regions, an electrode embedded in the chuck body and a barrier layer provided between the first and second regions. In this regard, the first region has a different composition than the second region.

According to another aspect of the present invention, a method for processing a semiconductor wafer is provided, in which an electrostatic chuck is provided, which includes a chuck body having an electrode embedded therein, placing a semiconductor wafer on a chucking surface of the electrostatic chuck, biasing the electrode to generate a chucking force to retain the semiconductor wafer, and subjecting the semiconductor wafer to a processing operation. In this regard, the electrostatic chuck includes dielectric and insulating regions, as well as a barrier layer provided between the dielectric and the insulating regions. The insulating region has a higher electrical resistivity than that of the dielectric region, and the dielectric region terminates at a major surface of electrostatic chuck to define a chucking surface.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention relates to an electrostatic chuck having a metallic element embedded in a ceramic body. The metallic element can be, for example, a heating element or an electrode, or both a heating element and an electrode provided as separate metallic elements. In addition, in the case of an electrode, multiple electrodes may be embedded in the ceramic body.

Figure 1:
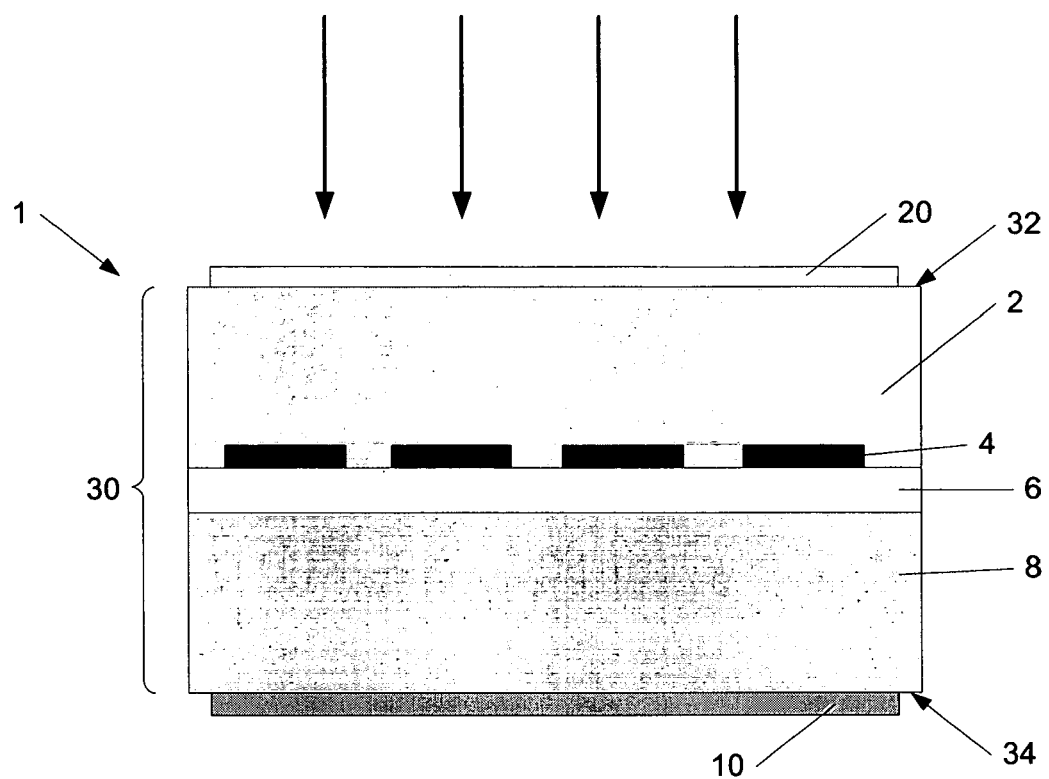
FIG. 1 illustrates a first embodiment of the present invention, in which an electrostatic chuck supports a semiconductor wafer which is undergoing a processing operation.

FIG. 1 is a cross-sectional diagram of electrostatic chuck 1 according to an embodiment of the present invention. The electrostatic chuck 1 includes a chuck body 30 formed principally of a ceramic material suitable for use in a semiconductor processing environment. The chuck body 30 includes a dielectric region 2 and an insulating region 8, and has an electrode 4 embedded therein. Provided between and in this case separating the dielectric region 2 and the insulating region 8, a barrier layer 6 is provided. While the barrier layer contacts both the dielectric region and the insulating region, the barrier layer may not be in direct contact in other embodiments. The dielectric region 2 extends from electrode 4 through a thickness direction of chuck body 30, and terminates at a first major surface 32 which defines a chucking surface, on which semiconductor wafer 20 rests. Further, insulating region extends from the electrode 4 (but does not contact electrode 4 as illustrated in FIG. 1), toward a second major surface 34 of chuck body 30 which defines a backside of chuck body 30. In the embodiment shown in FIG. 1, the insulating region 8 itself defines and terminates at the second major surface 34.

Metallic element 10 represents a pedestal which is generally understood in the art and which supports the chuck body 30. The pedestal may have various structural features, including passages and cooling orifices for respectively routing electrical contacts and cooling fluid into the chuck body 30. In addition, while not shown in FIG. 1, typically electrical contacts for biasing or applying a voltage to electrode 4 are implemented, and penetrate through a thickness direction of the chuck body 30 to make contact with the electrode 4, as well as to make contact with other active elements, such as additional electrodes and heating elements (not shown).

As illustrated by the arrows in FIG. 1, the semiconductor wafer 20 is being subjected to a processing operation. The processing operation may be a deposition process, such as physical vapor deposition or chemical vapor deposition. Deposition is typically carried out at an elevated temperature such as within a range of about 250° C. to about 700° C. Alternatively, the processing operation may be an etch process, for example, in which an etching species is exposed to the semiconductor wafer, to remove targeted materials from an exposed surface of the semiconductor wafer, such as a dielectric material for subsequent metallization.

Figure 2:
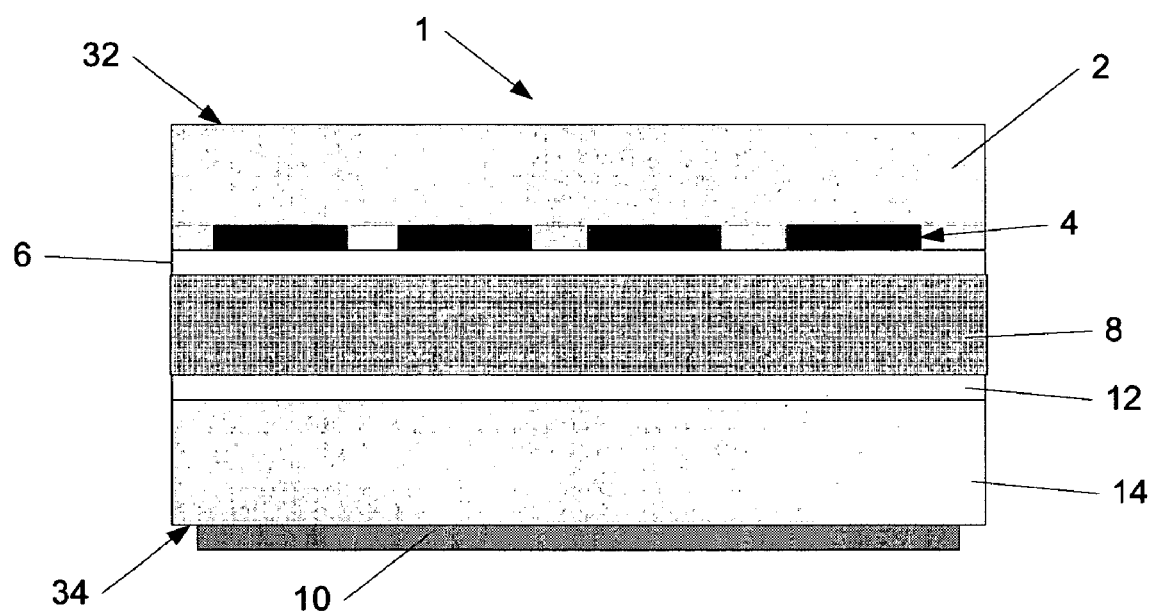
FIG. 2 illustrates another embodiment of an electrostatic chuck according to the present invention.

While in the embodiment shown in FIG. 1, the insulating region 8 terminates at and defines second major surface 34 defining the backside of the chuck body 30, additional regions may be implemented below or under the electrode. For example, as shown in FIG. 2, a second insulating region 14 is provided which defines the second major surface 34, and is separated from insulating region 8 by incorporation of a second barrier layer 12. While the insulating region 8 extends from the electrode 4 toward the second major surface 34, it neither contacts the electrode nor defines the backside of the chuck body 30. A characteristic common to both embodiments shown in FIGS. 1 and 2 is that both the dielectric region 2 and the electrode 4 are separated from the insulating region 8 by incorporation of a barrier layer 6.

Figure 3:
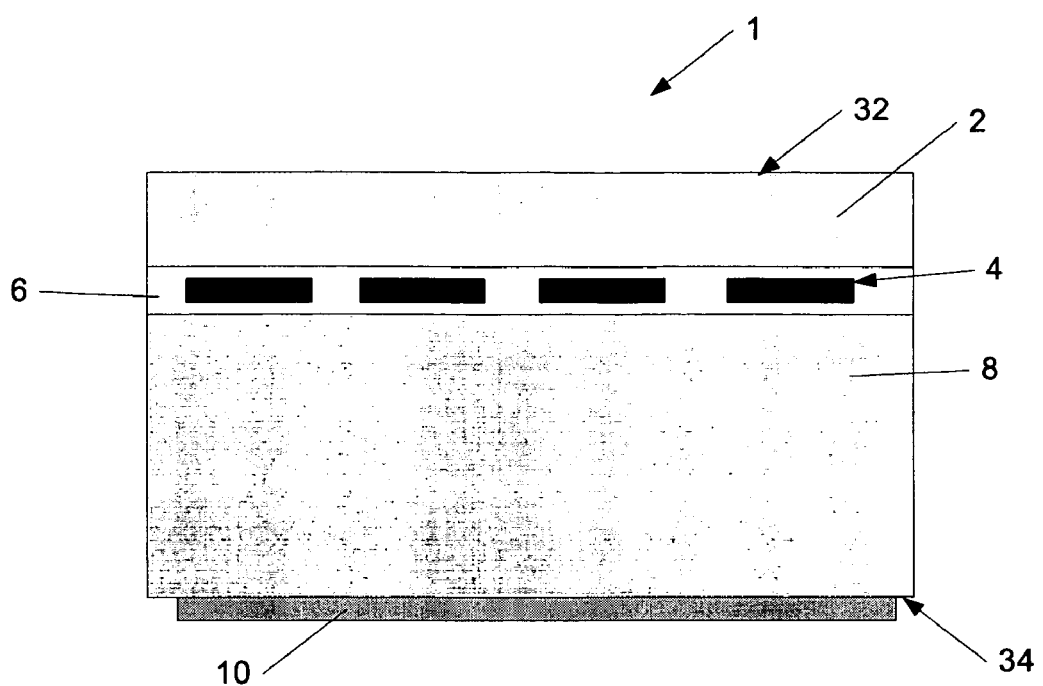
FIG. 3 represents yet another embodiment of an electrostatic chuck according to the present invention.

Turning to FIG. 3, yet another embodiment is illustrated, in which not only are the dielectric region 2 and the electrode isolated from or separated from the insulating region 8 by use of a barrier layer, but also, the electrode 4 is separated from the dielectric region 2 by barrier layer 6. In this particular embodiment, the electrode 4 is embedded completely within the barrier layer 6 such that portions of the barrier layer extend above and below the electrode 4, separating the electrode 4 from the dielectric region 2 and from the insulating region 8, respectively.

The chuck body 30 is generally formed of a ceramic material, which includes desirable materials such as aluminum nitride (AlN), aluminum oxide ($Al_2O_3$), boron nitride (BN) and combinations thereof. Depending on the dielectric properties of the ceramic material, the electrostatic chuck 1 can be a Coulombic type electrostatic chuck, a Johnson-Rahbek type electrostatic chuck or another chuck or susceptor known in the art.

In one embodiment, the same base material is used for the major portions of the chuck body 30, namely the dielectric region and the insulating region. For example, both regions may be formed of aluminum nitride base material. In order to effect desirable electrical resistivity properties in each of the regions, namely, to provide a resistivity in the dielectric region 2 that is lower than the intrinsic resistivity of pure aluminum nitride, and to provide an electrical resistivity in the insulating region 6 that is equal to or higher than the intrinsic resistivity of pure aluminum nitride, additives may be used in one or both of the dielectric region and the insulating region. Such additives are referred to herein as resistivity-modifying additives for modifying electrical resistivity in the above region(s). As used in the insulating region, the resistivity-modifying additive is effective to increase the electrical resistivity. Examples of such additives include magnesium, lithium. Alternatively, or additionally, resistivity-modifying additives may be provided in the dielectric region.

As an alternative to the use of the same base material for both of the insulating region and the dielectric regions, different base materials may be utilized for the dielectric and the insulating regions. For example, the dielectric region may utilize an aluminum nitride base material, the insulating region utilizing an aluminum oxide, a nitride, or another oxide or non-oxide ceramic material which has an intrinsic electrical resistivity higher than aluminum nitride, or which can be easily modified to have a higher resistivity than aluminum nitride. One particular embodiment combines an aluminum nitride-based dielectric region with an aluminum oxide-based insulating region. In this regard, as used herein, the term "based" generally refers to a composition in which the identified base material forms a majority portion of the particular region being described, and preferably, forms at least 70 weight percent. In certain embodiments, the base material forms at least 80 or 90 weight percent of the identified region of the electrostatic chuck.

In contrast, the dielectric and insulating regions with different electrical resistivities may be provided by utilizing essentially the same base material, such as aluminum nitride, and even utilizing the same additive package (if any). In this regard, the differential in resistivities may be engineered into those particular regions by choosing different grades of aluminum nitride, such as those found from different commercial vendors. For example, one grade of aluminum nitride powder may be formed by carbothermal reduction, and a second grade formed by nitridation of an aluminum source, such as nitridation of alumina. Commercially available carbothermally-reduced aluminum nitride powders tend to have a lower residual oxygen content provided within the crystal lattice, as compared with other commercially available aluminum nitride powders. As such, the carbothermally reduced aluminum nitride powder is particularly suitable for use in the dielectric region to achieve a lower electrical resistivity.

The particular grades of aluminum nitride powders may be defined through other characteristics as well, in addition to or in place of the particular fabrication technique. For example, the differently graded aluminum nitride powders may have distinct particle size distributions, average particle size, powder particle aspect ratios, as well as specific surface areas. For example, one powder may have a bi-modal particle size distribution, the other mono-modal.

Alternatively, or in combination with the foregoing use of aluminum nitride powders having different grades, use of aluminum nitride powders with different additive packages, and use of different base compositions, particular process conditions may be employed to modify the electrical resistivity of the particular regions. In this regard, attention is drawn to patent application Ser. No. 60/562,385, filed on Apr. 15, 2004 incorporated herein by reference. This application, commonly owned by the present assignee, describes various processing conditions which may be manipulated to tailor resistivity of the regions.

Typically, the relative difference in electrical resistivity between the dielectric and insulating regions is significant. For example, the insulating region generally has at least two times, typically at least four times the electrical resistivity of the dielectric region. In certain embodiments, the electrical resistivity of the insulating region is at least eight times greater than the electrical resistivity of the dielectric region, such as ten times greater or more. The particular value of the electrical resistivity of the dielectric and insulating regions may vary. However, the dielectric region typically has an electrical resistivity that is within a range of about $10^8$ to about $10^{13}$ ohm-cm, after densification. The electrical resistivity of the insulating region typically is within a range of about $10^9$ to about $10^{14}$ ohm-cm, after densification.

In the case of utilizing aluminum nitride as a base material for the dielectric and insulating regions, suitable powders include those having an average particle size within a range of about 0.1 to about 5.0 microns. Preferably, the powder has an average particle size of at least about 1.4 microns. The powder may have a specific surface area of less than about 4.5 $m^2/g$. Commercial or technical grades of powder can be employed, although it is preferable to use a semiconductor-grade powder having a low impurity content such as on the order of not greater than 1000 ppm total of metal impurities, preferably less than about 500 ppm, such as less than about 250 ppm.

Certain embodiments may utilize a powder such as aluminum nitride to form the insulating and dielectric regions without the use of sintering aids or binders, while other embodiments utilize such additives to enhance processing. For example, aluminum nitride powder may be combined with a sintering aid comprised of a rare earth oxide such as $Y_2O_3$. Other sintering aids include calcium fluoride ($CaF_2$), calcium oxide (CaO), and calcium carbonate ($CaCO_3$).

Turning to the electrode 4 embedded within the chuck body 30, the electrode is typically embedded so as to be encapsulated by the chuck body 30 to protect the electrode from corrosive gases present in the processing chamber during semiconductor processing. Typically, the distance between the electrode 4 and the chucking surface 32 ranges from about 0.5 mm to about 2.0 mm. While distinct regions are illustrated in the figures, the electrostatic chuck 1 can have a monolithic, layered or laminated structure. In this regard, different powders or grades of powder may be layered on top of each other and cold-pressed to form a green body with regions of distinct properties, which is then sintered such as during a hot-pressing operation or a pressureless sintering operation. In the case of a monolithic chuck body 30, distinct interfaces may not be readily discernable between the various regions, although such regions typically have distinct electrical resistivity properties, and in particular the dielectric region 2 and the insulating region 8.

Turning back to the electrode 4, this element may be formed of a foil, a perforated foil, a solid plate, a perforated plate, a mesh, a screen printed layer, or have some other configuration that is suitable for incorporation into electrostatic chucks. Insulating region 14 can be a pre-fabricated layer which is incorporated in a powder compact forming chuck body 30, or can be formed in situ during fabrication of the chuck body 30. Preferably the electrode is fabricated from a metal or metal alloy, typically, the electrode is molybdenum (Mo) or tungsten (W) based, or have a base that is a combination of molybdenum and tungsten. Optionally, the molybdenum, tungsten or molybdenum-tungsten electrode can include additional secondary metals, such as nickel (Ni) or cobalt (Co). Other suitable materials which can be used for tailoring certain properties of the electrode include tantalum (Ta), platinum (Pt), rhodium (Rh) and hafnium (Hf).

While not shown in the drawings, typically an electrical contact is provided so as to extend through the chuck body 30 and make ohmic contact with the electrode. Details relating to the composition of the electrode and suitable contact are provided in U.S. patent application Ser. No. 09/730,047, filed Dec. 5, 2000, the subject matter thereof being incorporated herein.

According to a particular feature of the present invention, a barrier layer such as barrier layer 6 is provided between the insulating region and the dielectric region. The barrier layer typically functions to separate the dielectric region from the insulating region to prevent diffusion of material between those regions. Alternatively, or additionally, the barrier layer functions to prevent chemical reactions between the two regions. The barrier layer may be particularly beneficial in those embodiments in which the dielectric and insulating regions contain respectively different compositions, or the same base composition with different additives. For example, in the case of an aluminum nitride-based dielectric region and an alumina-based insulating region, the barrier layer can prevent unwanted diffusion of material between the regions as well as prevent unwanted chemical reactions between the regions. In another embodiment, aluminum nitride-based compositions may be utilized for both the regions, but have different additives such as resistivity modifying additives or sintering aids. The barrier layer would thus function to prevent the dissimilar additives from diffusing between the two regions. In yet another embodiment, as discussed above, the compositional features may be essentially indistinguishable between the two regions, but have different properties, such as electrical resistivity, due to differences in processing (e.g., different high temperature treatment operations, different aluminum nitride grades, and use of certain heating plates). In this case, the barrier layer functions to prevent unwanted chemical reactions between the two regions.

The barrier layer may be provided in situ, utilizing conventional powder-based formation techniques, such as by loading the precursor barrier layer material into a mold, and pressing so as to form the barrier layer. Pressing may be carried out in a single step along with the embedded electrode and dielectric and insulating regions to form a green body (i.e., cold pressing), or in a single step to form a densified body (i.e., hot pressing). Alternatively, the barrier layer may be provided and formed separately from the insulating and dielectric regions, and joined to these regions by a high temperature pressing operation or high temperature bonding operation.

The invention claimed is:

1. An electrostatic chuck for supporting a semiconductor wafer, comprising:
    a chuck body including a dielectric region comprising AlN and an insulating region comprising AlN, the insulating region having a higher electrical resistivity than the dielectric region;
    an electrode embedded in the chuck body; and
    a barrier layer provided between dielectric region and the insulating region, wherein the barrier layer separates the dielectric region from the insulating region to prevent chemical reactions between the dielectric region and the insulating region, or to prevent diffusion of material between the dielectric region and the insulating region.

2. The electrostatic chuck of claim 1, wherein at least one of the dielectric region and the insulating region includes a resistivity-modifying additive for modifying electrical resistivity, the barrier layer being effective to prevent diffusion of said resistivity-modifying additive between the insulating region and the dielectric region.

3. The electrostatic chuck of claim 2, wherein the resistivity-modifying additive is provided in the insulating region, and comprises at least one component from the group consisting of magnesium and lithium.

4. The electrostatic chuck of claim 1, wherein the chuck body has first and second opposite major surfaces, the first surface defining a chucking surface for receiving a semiconductor wafer, the second surface defining a backside of the chuck body, the dielectric region defining the chucking surface and extending between the chucking surface and the electrode.

5. The electrostatic chuck of claim 4, wherein the insulating region is present between the electrode and the backside of the chuck body.

6. The electrostatic chuck of claim 4, further comprising a second dielectric region extending between the insulating region and the backside of the chuck body.

7. The electrostatic chuck of claim 1, further comprising a second barrier layer provided between the insulating region and the second dielectric region.

8. The electrostatic chuck of claim 1, wherein the barrier layer extends between the electrode and the insulating region thereby isolating the electrode from the insulating region.

9. The electrostatic chuck of claim 8, wherein the electrode is embedded in the barrier layer such that the barrier layer isolates the electrode from both the insulating region and the dielectric region.

10. The electrostatic chuck of claim 1, wherein the electrode comprises at least one component from the group consisting of molybdenum and tungsten.

11. The electrostatic chuck of claim 1, wherein the insulating region has an electrical resistivity that is at least two times greater than an electrical resistivity of the dielectric region.

12. The electrostatic chuck of claim 11, wherein the insulating region has an electrical resistivity that is at least four times greater than an electrical resistivity of the dielectric region.

13. The electrostatic chuck of claim 12, wherein the insulating region has an electrical resistivity that is at least eight times greater than an electrical resistivity of the dielectric region.

14. The electrostatic chuck of claim 1, wherein the dielectric region has an electrical resistivity that is within a range of about $10^8$ to about $10^{13}$ ohm-cm.

15. The electrostatic chuck of claim 1, wherein the insulating region has an electrical resistivity that is within a range of about $10^9$ to about $10^{14}$ ohm-cm.

16. A method for processing a semiconductor wafer, comprising:

providing an electrostatic chuck having a chuck body including a dielectric region comprising AlN and an insulating region comprising AlN, an electrode embedded in the chuck body, and a barrier layer provided between dielectric region and the insulating region, wherein the insulating region has a higher electrical resistivity than the dielectric region the dielectric region terminates at a major surface of the electrostatic chuck, defining a chucking surface, and wherein the barrier layer separates the dielectric region from the insulating region to prevent chemical reactions between the dielectric region and the insulating region, or to prevent diffusion of material between the dielectric region and the insulating region;

placing a semiconductor wafer on the chucking surface of the electrostatic chuck;

biasing the electrode, to generate a chucking force to retain the semiconductor wafer on the electrostatic chuck; and subjecting the semiconductor wafer to a processing operation.

* * * * *